(12) United States Patent
Iovdalsky

(10) Patent No.: US 6,204,555 B1
(45) Date of Patent: Mar. 20, 2001

(54) MICROWAVE-FREQUENCY HYBRID INTEGRATED CIRCUIT

(75) Inventor: Viktor Anatolievich Iovdalsky, Moskovskaya (RU)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/077,761
(22) PCT Filed: Oct. 10, 1996
(86) PCT No.: PCT/RU96/00294
  § 371 Date: Jul. 26, 1999
  § 102(e) Date: Jul. 26, 1999
(87) PCT Pub. No.: WO98/15981
  PCT Pub. Date: Apr. 16, 1998
(51) Int. Cl.[7] .................................................. H01L 23/34
(52) U.S. Cl. ......................... 257/728; 257/622; 257/723; 257/724
(58) Field of Search .................................. 257/618, 728, 257/622, 723, 724

(56) References Cited

U.S. PATENT DOCUMENTS 5,157,479 * 10/1992 Sekiguchi et al. ...................... 357/74
5,814,883 * 9/1998 Sawai ................................... 257/712

* cited by examiner

*Primary Examiner*—David Hardy
*Assistant Examiner*—Lourdes Cruz
(74) *Attorney, Agent, or Firm*—Piper Marbury Rudnick & Wolfe

(57) ABSTRACT

The microwave hybrid integrated circuit, is providing having a dielectric board (1) provided with a topological metallization pattern (2) and a number of recesses (3) in which semiconductor chips (5) are fixed with a binder (4). The face surface of the chips (5) provided with contact pads (6) are coplanar with the surface of the board (1), and the contact pads (6) of the chips (5) are electrically connected to the topological metallization pattern (2). The walls of the recesses (3) are inclined towards the plane of the board (1) at an angle ($\alpha$) of 90.1 to 150°.

2 Claims, 2 Drawing Sheets

MICROWAVE-FREQUENCY HYBRID INTEGRATED CIRCUIT

FIELD OF THE INVENTION

The present invention relates in general to electronic engineering and more specifically to a microwave hybrid integrated circuit (IC).

BACKGROUND OF THE INVENTION

A microwave hybrid IC is known, the circuit comprising a dielectric board having a topological metallization pattern and semiconductor chips which are arranged in the substrate so that the face surface of each chip with contact pads are located in the same plane with the substrate surface, and the contact pads of the chips are electrically connected to the topological metallization pattern see U.S. Pat. No. 4,772, 914.

The aforementioned hybrid IC, however, is possessed of a dispersion in the circuit electrical parameters resulted from variations in the length of interconnecting wires due to possible displacement of the semiconductor chip along the bottom of the recess from one of its walls towards the other one.

One more prior-art microwave hybrid IC is known, the circuit comprising a dielectric board with a topological metallization pattern and recesses, wherein the chips of the chip-type semiconductor devices are secured with the aid of a binder so that the face surface of the chips with the contact pads is coplanar with the board surface, and the contact pads of the chips are electrically connected to the topological metallization pattern (JP, B, 49-12794).

The aforecited hybrid IC is possessed of a low reproducibility of its electrical parameters due to chip displacement along the bottom of the recess during its fitting with the resultant variations in the length of interconnecting wires.

SUMMARY OF THE INVENTION

The principal object of the present invention is to provide a microwave hybrid integrated circuit, wherein the recesses are provided in the dielectric board, in which recesses the semiconductor chips being fixed, so as to allow enhancing the reproducibility and manufacturability of the electrical parameters of the IC.

The foregoing object is accomplished due to the fact that in a microwave hybrid IC, comprising a dielectric board provided with a topological metallization pattern and a number of recesses in which the semiconductor chips are fixed with a binder, the face surface of the chips provided with contact pads being coplanar with the board surface plane, while the contact pads of the chips are electrically connected to the topological metallization pattern, according to the present invention, the walls of each recess are inclined towards the board surface at an angle of 90.1 to 150°.

Making the angle of inclination of the walls towards the plane of the board surface less than 90.1° does not give any positive results and making said angle more than 150° elongates substantially the length of connecting leads and hence the spurious inductance.

The recesses may be metallized and the metal coating may be electrically connected to the topological metallization of the board. The board may be provided with the shield grounding metallization on its back side, and in the bottom of the recesses the metallized holes may be made, filled with an electrically and heat conducting material, for connection with the shield grounding metallization.

Performing the walls of the recesses inclined towards the plane of the board surface at an angle $\alpha=90.1$ to $150°$ ensures:

first, restricting the possibility of chip displacement along the bottom of the recesses and hence reducing the variation in the length of conductors interconnecting the contact pads with the topological metallization and therefore enhancing reproducibility of the circuit electrical parameters;

second, enhancing the accuracy of the chip fitting in the recess and its orienting therein, as well as simpliying the electric connection between metallization of the recess and the topological metallization, thereby increasing the manufacturability.

BRIEF DESCRIPTION OF THE DRAWINGS

The present invention is illustrated by a detailed description of some specific exemplary embodiments thereof to be taken with reference to the accompanying drawings, wherein.

BEST METHOD OF CARRYING OUT THE INVENTION

Figure 1:
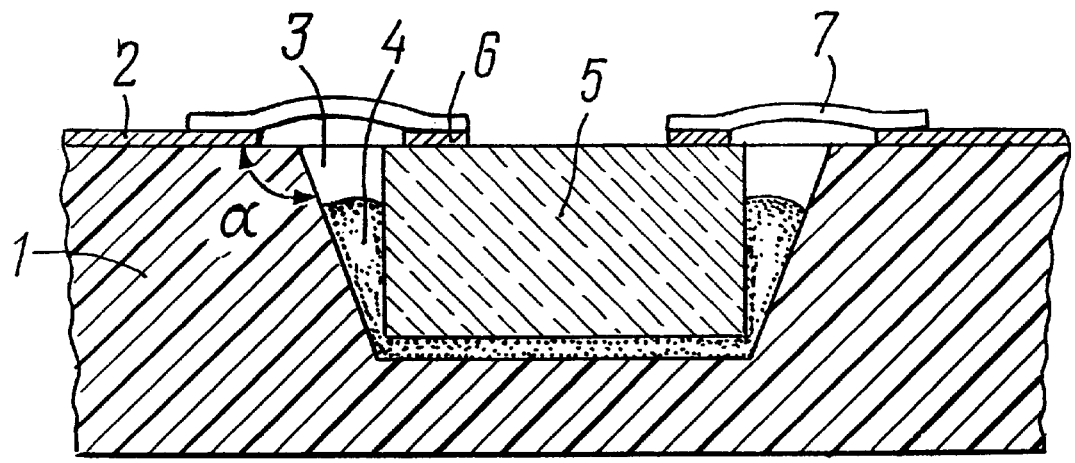
FIG. 1 is a sectional view of the filed microwave hybrid IC.
Figure 2:
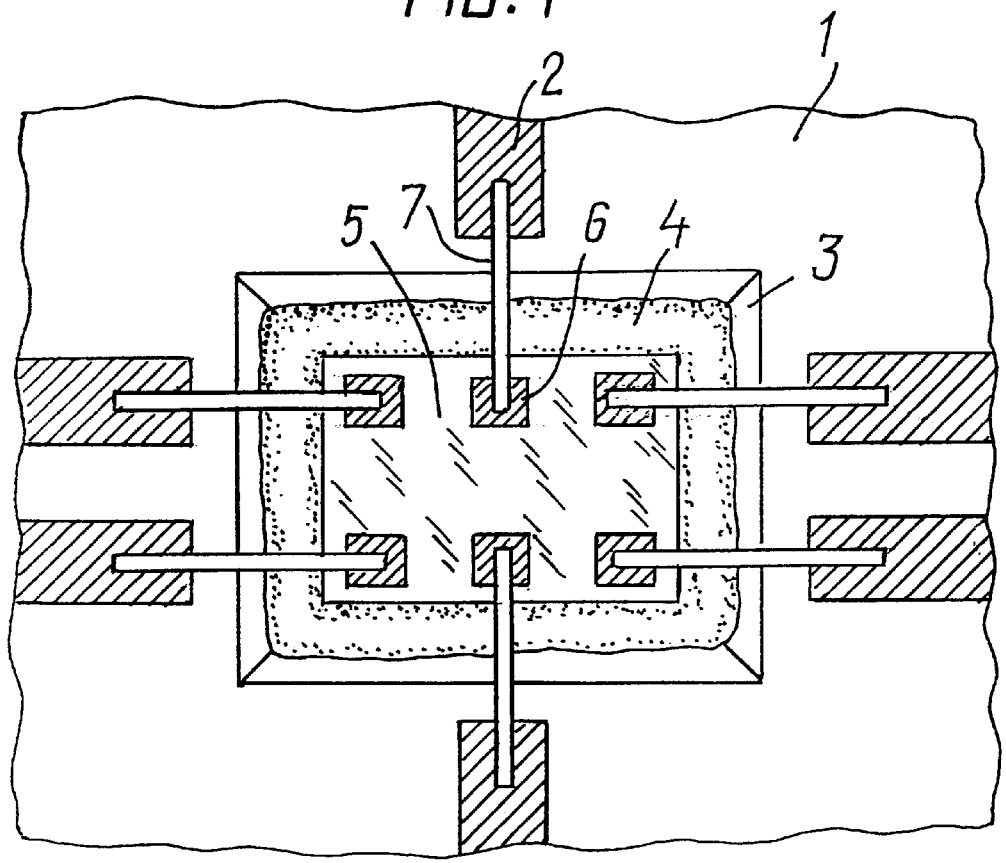
FIG. 2 is a plan view of FIG. 1.

The microwave hybrid IC, according to the invention, comprises a 0.5 mm thick dielectric board 1 (FIGS. 1 and 2) made of, e.g., Polycor and having a topological metallization pattern 2 on the face side thereof The topological metallization may be of a Cr—Cu structure (3 $\mu$m thick applied by a spray-deposition technique)—Cu (3 $\mu$m thick electroplated)—Ni (0.5 $\mu$m thick electroplated)—Au (3 $\mu$m thick electroplated). The board 1 has a number of recesses 3, each of, e.g., 0.6×0.6×0.16 mm having an angle $\alpha$ of inclination of the walls towards the plane of the board surface equal to $\alpha=120°$. In this case, with the layer of a binder 4 on the bottom of the recess being 10 $\mu$m thick, a distance between a chip 5 and the upper edge of the recess 3 equals 87 $\mu$m. An adhesive 1 such as ЭЧЭ-C (Standard Specifications bIyO 0.028.052 TY) may be used as the binder 4.

The chip 5 of the chip transistor 3П325A-5 of 0.5×0.5× 0.15 mm is mounted in the recess 3 so that its surface is coincided with the surface plane of the board 1. Contact pads 6 of the chip 5 are electrically connected to the topological metallization pattern 2 by means of a 15 $\mu$m diameter golden wire 7.

Figure 3:
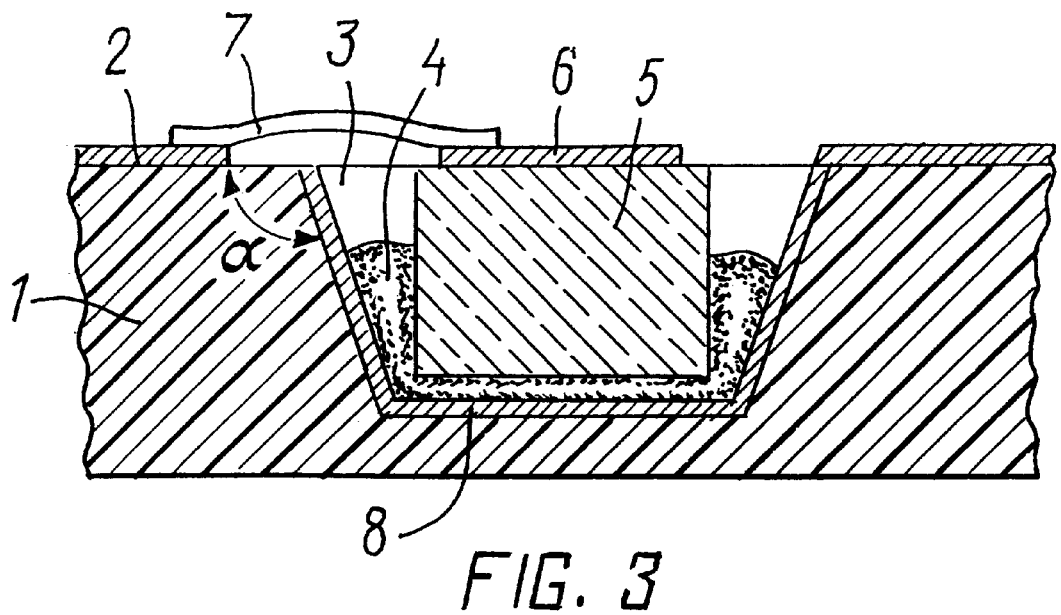
FIG. 3 is a sectional view of another embodiment of the filed microwave hybrid IC.

The recesses 3 (FIG.3) may be metal-coated and the structure of metallization 8 may be, e.g., Pd—Ni (0.2 $\mu$m thick chemically deposited)—Cu (3 $\mu$m electroplated)—Ni (0.5 $\mu$m electroplated)—Au (3 $\mu$m electroplated).

Figure 4:
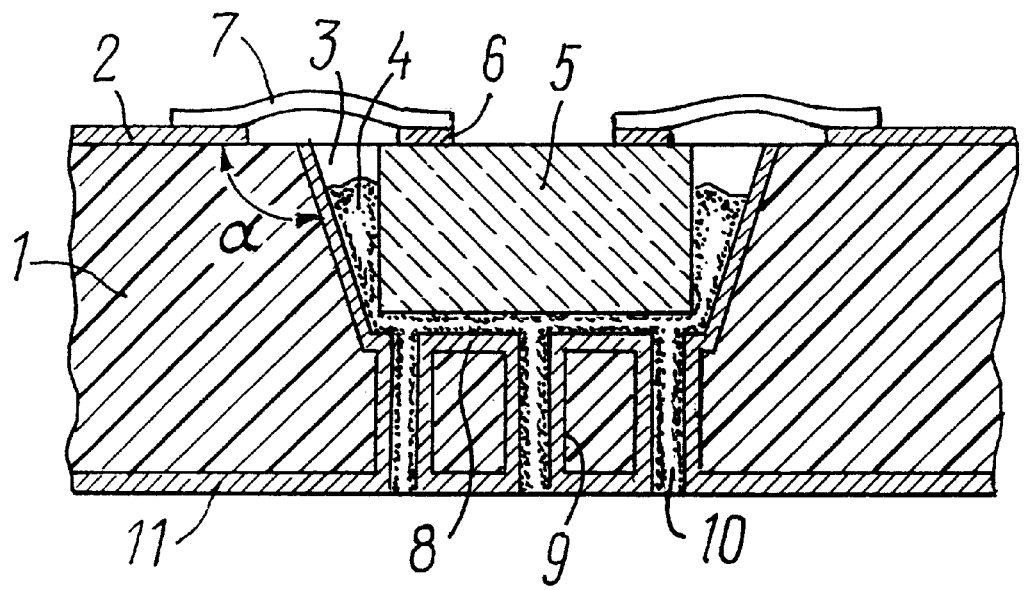
FIG. 4 is a sectional view of still another embodiment of the filed microwave hybrid IC.

In the bottom of the recess 3 (FIG.4) metallized holed 9 are made having a diameter of, e.g., 100 $\mu$m filled with an electrically and heat conducting material 10, for instance, grown with copper preliminarily activated with $PdCl_2$+ $SnCl_2$. The back side of the board 1 is provided with a shield grounding metallization 11 having a structure similar to that of the metallization 2 on the face side of the board 1.

The microwave hybrid integrated circuit, according to the invention, functions as follows,:

A signal is applied to the input of the transistor amplifier stage, which undergoes an appropriate conversion, whereupon the amplified signal arrives at the stage output.

The filed microwave hybrid integrated circuit allows to increase the reproducibility of electrical circuit parameters by reducing the variation in the length of the interconnecting wires (leads) of the semiconductor chip to increase the manufacturability due to a more accurate fitting of the chip in the recess and its orientation therein, as well as due to a simpler connection between the recess metallization and the topological metallization pattern. All the mentioned above makes it possible to reduce the laboriousness of the circuit trimming procedure.

Moreover, the metallization of the recesses and their connection to the topological metallization pattern allows to enhance the circuit reliability.

In describing the disclosed embodiments of the present invention, specific narrow terminology is used for the sake of clarity. However, the invention is not restricted to the specific terms so selected, and it should be understood that each such term covers all equivalent elements functioning in a similar way and used for solving similar problems.

Although the present invention has been described herein with reference to the preferred embodiment, it will be understood that various modifications and alterations may occur to the details of construction without departing from the spirit and scope of the invention, as will be readily understood by those skilled in the art.

All these modifications and alterations should be considered to remain within the limits of the spirit and scope of the invention and the claims that follow.

Industrial Applicability

The present invention can be used in semiconductor microelectronics.

What is claimed is:

1. A microwave hybrid integrated circuit, comprising:

a dielectric board having a plane, a surface and at least one recess, the recess includes a wall, the wall of the recess is inclined towards the plane of the board at an angle ( ) of 90.1 to 150°, and the recess includes a metalization;

a topological metalization pattern on the board, the topological metallization pattern is electrically connected to the metalization of the recess; and a semiconductor chip having a surface, the semiconductor chip fixed in the recess with a binder, the surface of the semiconductor chip having a contact pad, the contact pad is coplanar with the surface of the dielectric board and is electrically connected to the topological metalization pattern.

2. The circuit of claim 1, wherein the dielectric board includes a back side and a shield on the back side, and the recess includes a bottom and metalized holes are provided in the bottom, the metalized holes being filled with an electrically and heat conducting material.

* * * * *